United States Patent
Chan et al.

(10) Patent No.: US 9,054,257 B2
(45) Date of Patent: Jun. 9, 2015

(54) WATER RESISTANT LED DEVICES AND AN LED DISPLAY INCLUDING SAME

(71) Applicant: Cree Huizhou Solid State Lighting Company Limited, Huizhou (CN)

(72) Inventors: Chi Keung Chan, Sheung Shui (HK); Chak Hau Pang, Fanling (HK); Fei Fei Ruan, Huizhou (CN); Fei Hong Li, Huizhou (CN)

(73) Assignee: Cree Huizhou Solid State Lighting Company Limited, Guangdong (CN)

( * ) Notice: Subject to any disclaimer, the term of this patent is extended or adjusted under 35 U.S.C. 154(b) by 0 days.

(21) Appl. No.: 13/683,427

(22) Filed: Nov. 21, 2012

(65) Prior Publication Data

US 2013/0134454 A1 May 30, 2013

Related U.S. Application Data

(63) Continuation of application No. PCT/CN2011/082840, filed on Nov. 24, 2011.

(51) Int. Cl.
| | |
|---|---|
| *H01L 29/18* | (2006.01) |
| *H01L 33/08* | (2010.01) |
| *H01L 33/62* | (2010.01) |
| *H01L 33/48* | (2010.01) |
| H01L 33/60 | (2010.01) |
| G02F 1/1335 | (2006.01) |

(52) U.S. Cl.
CPC ............... *H01L 33/08* (2013.01); *H01L 33/60* (2013.01); *H01L 33/62* (2013.01); *G02F 1/133603* (2013.01); *H01L 33/486* (2013.01); *H01L 2933/0033* (2013.01); *H01L 2224/48091* (2013.01)

(58) Field of Classification Search
CPC .............................. H01L 33/62; H01L 33/486
USPC ....................................................... 257/88, 98
See application file for complete search history.

(56) References Cited

U.S. PATENT DOCUMENTS

| | | | | |
|---|---|---|---|---|
| 7,999,280 | B2 * | 8/2011 | Kim et al. | 257/99 |
| 8,480,254 | B2 * | 7/2013 | Lu | 362/249.02 |
| 2007/0221935 | A1 * | 9/2007 | Tseng et al. | 257/98 |

(Continued)

FOREIGN PATENT DOCUMENTS

| | | |
|---|---|---|
| CN | 101127350 A | 2/2008 |
| CN | 201057385 Y | 5/2008 |

(Continued)

OTHER PUBLICATIONS

ISA and Written Opinion to PCT Application No. PCT/CN2011/082840 dated Aug. 30, 2012 (17p).

*Primary Examiner* — Douglas Menz
(74) *Attorney, Agent, or Firm* — Brinks Gilson & Lione

(57) ABSTRACT

The disclosure provides an LED package including a first plastic portion having a mounting surface and a lower surface. In some embodiments, the LED package includes a second portion surrounding the first plastic portion and exposing the mounting surface and the lower surface of the first plastic portion. In other embodiments, the first plastic portion includes at least one of a hole or a protrusion and the second portion includes corresponding structure filing the hole or surrounding the protrusion of the first plastic portion. The first plastic portion and the second portion have different optical properties.

18 Claims, 14 Drawing Sheets

(56) References Cited

U.S. PATENT DOCUMENTS

2010/0200882 A1* 8/2010 Kotani et al. .................. 257/98
2010/0230693 A1   9/2010 Tran

FOREIGN PATENT DOCUMENTS

| CN | 101246938 A | 8/2008 |
| CN | 101645218 A | 2/2010 |

* cited by examiner

WATER RESISTANT LED DEVICES AND AN LED DISPLAY INCLUDING SAME

RELATED APPLICATIONS

This application is a continuation of International Application No. PCT/CN2011/082840, filed Nov. 24, 2011, the entire content of which is incorporated by reference herein.

FIELD OF THE DISCLOSURE

The disclosure relates, generally, to light emitting diodes (LEDs) and, more particularly, to water resistant LED devices with two portions having different optical properties and to LED displays including such devices.

BACKGROUND

In recent years, there have been dramatic improvements in LED technology such that LEDs of increased luminance and color fidelity have been introduced. Due to these improved LEDs and improved image processing technology, large format, full color LED video screens have become available and are now in common use. LED displays typically comprise a combination of individual LED panels providing image resolution determined by the distance between adjacent pixels or "pixel pitch."

In order to use an LED chip in conventional applications it is known to enclose an LED chip in a package to provide environmental and/or mechanical protection, color selection, light focusing and the like. An LED package also includes electrical leads, contacts or traces for electrically connecting the LED package to an external circuit. In a typical two-pin LED package/component 10, shown in FIG. 25, a single LED chip 12 is mounted on a transparent reflective cup 13 by means of a solder bond or conductive epoxy. One or more wire bonds 11 connect the ohmic contacts of the LED chip 12 to leads 15A and/or 15B, which may be attached to or integral with the transparent reflective cup 13. The reflective cup 13 may be filled with a transparent encapsulant material 16 and a wavelength conversion material, such as a phosphor, can be included in or over the LED chip or in the encapsulant. Light emitted by the LED at a first wavelength may be absorbed by the phosphor, which may responsively emit light at a second wavelength. The entire assembly can then be encapsulated in a clear protective resin 14, which may be molded in the shape of a lens to direct or shape the light emitted from the LED chip 12.

The conventional LED package 20 shown in FIG. 26 may be more suited for high power operations which may generate more heat. In the LED package 20, one or more LED chips 22 are mounted onto a ceramic based carrier such as a printed circuit board (PCB) carrier, substrate or submount 23. One or more LED chips 22 may include: a gallium nitride based blue LED chip, a gallium nitride based green LED chips, an AlInGaP red LED chip, a white LED chip, a blue LED chip, a yellow phosphor chip, or a red LED chip. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 21 are made between ohmic contacts on the LED chips 22 and electrical traces 25A, 25B on the submount 23. The mounted LED chips 22 are then covered with a transparent encapsulant 26, which may provide environmental and mechanical protection to the chips while also acting as a lens. The metal reflector 24 is typically attached to the carrier by means of a solder or epoxy bond.

Conventional LED packages, such as those shown in FIGS. 25 and 26, usually do not have a durable structure that withstands harsh external conditions. When used in LED displays, conventional LED packages present a problem because the LED package is not resistant to water. Accordingly, there is a need for a robust, water resistant, low profile LED device that offers weather resistance for use in outdoor displays and that can be produced with less material at low cost.

SUMMARY

A first embodiment discloses an LED package including a first plastic portion having a mounting surface and a lower surface. The LED package also includes a second portion surrounding the first plastic portion and exposing the mounting surface and the lower surface of the first plastic portion. The first plastic portion and the second portion have different optical properties.

A second embodiment discloses an LED package including a first plastic portion having at least one of a hole or a protrusion. The LED package also includes a second portion having corresponding structure filing the hole or surrounding the protrusion of the first plastic portion. The first plastic portion and the second portion have different optical properties.

A third embodiment discloses a display including a substrate carrying an array of LED packages arranged in vertical columns and horizontal rows. At least one of the LED packages includes a first plastic portion having a mounting surface and a lower surface. An LED is mounted on the mounting surface. The at least one of the LED packages also includes a second portion surrounding the first plastic portion and exposing the mounting surface and the lower surface of the first plastic portion. The first plastic portion and the second portion have different optical properties. The display also includes signal processing and LED drive circuitry electrically connected to selectively energize the array of LED packages for producing visual images on the display.

A fourth embodiment discloses a display including a substrate carrying an array of LED modules arranged in vertical columns and horizontal rows. At least one of the LED packages includes a first plastic portion having at least one of a hole or a protrusion. The at least one of the LED packages also includes a second portion having corresponding structure filing the hole or surrounding the protrusion of the first plastic portion. The first plastic portion and the second portion have different optical properties. The display also includes signal processing and LED drive circuitry electrically connected to selectively energize the array of LED packages for producing visual images on the display.

A fifth embodiment discloses a lead frame for an LED package. The lead frame includes a plurality of electrically conductive cathode parts each having a contact pad and a corresponding plurality of electrically conductive anode parts each having a corresponding mounting pad carrying an LED. The contact pad and the mounting pad have different surface areas.

A sixth embodiment discloses a lead frame for an LED package. The lead frame includes a plurality of electrically conductive cathode parts each having a contact pad and a cathode pin pad and a corresponding plurality of electrically conductive anode parts each having a mounting pad carrying an LED and an anode pin pad. The mounting pad has a thinner profile width than the anode pin pad.

DETAILED DESCRIPTION

Figure 1:
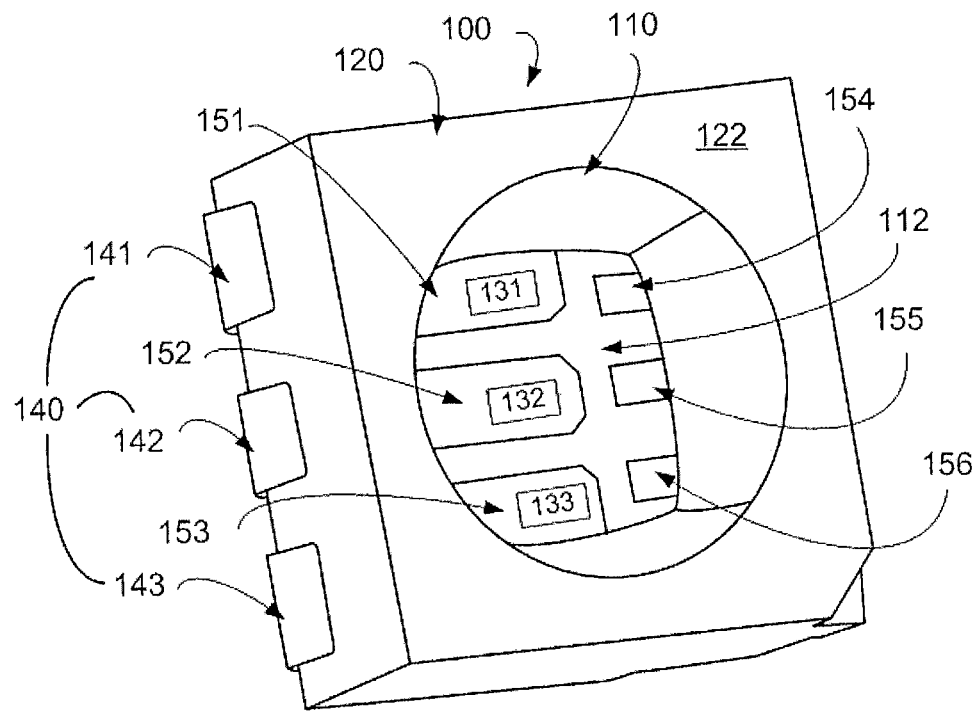
FIG. 1 illustrates a top perspective view of an LED package in accordance with a first embodiment in accordance with the present disclosure.

The following description presents preferred embodiments of the disclosure representing the best mode contemplated for practicing the disclosure. This description is not to be taken in a limiting sense but is made merely for the purpose of describing the general principles of the disclosure, the scope of which is defined by the appended claims.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
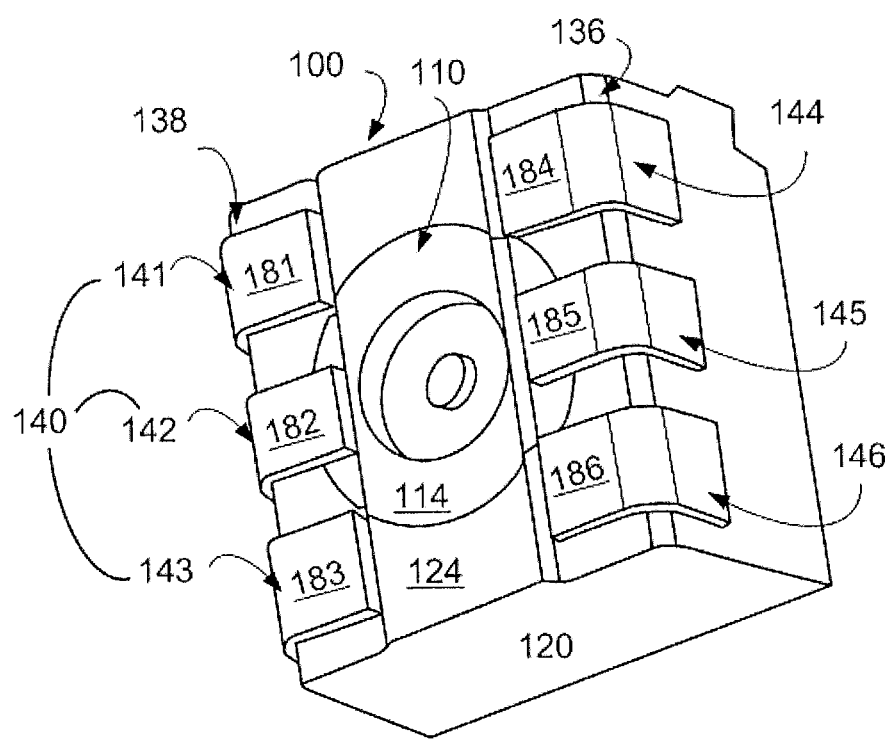
FIG. 2 illustrates a bottom perspective view of an LED package of FIG. 1.

FIG. 1-5 illustrate an embodiment of an LED package 100 in different perspective views. LED package 100 is a surface mount LED package that can include a number of LEDs and electrical wiring patterns to connect the LEDs to electrical sources as known by those skilled in the art. FIG. 1 is a top perspective view of LED package 100. FIG. 2 is a bottom perspective view of LED package 100. As illustrated in FIG. 1-2, LED package 100 includes an inner portion 110 having a mounting surface 112 and a lower surface 114. Inner portion 110 may be a plastic portion surrounded by an outer portion 120. Outer portion 120 exposes mounting surface 112 and the lower surface 114 of inner portion 110. Inner portion 110 and outer portion 120 have different optical properties. For example, inner portion 110 and outer portion 120 may have different colors, different reflectivities, or different transparencies.

Figure 22:
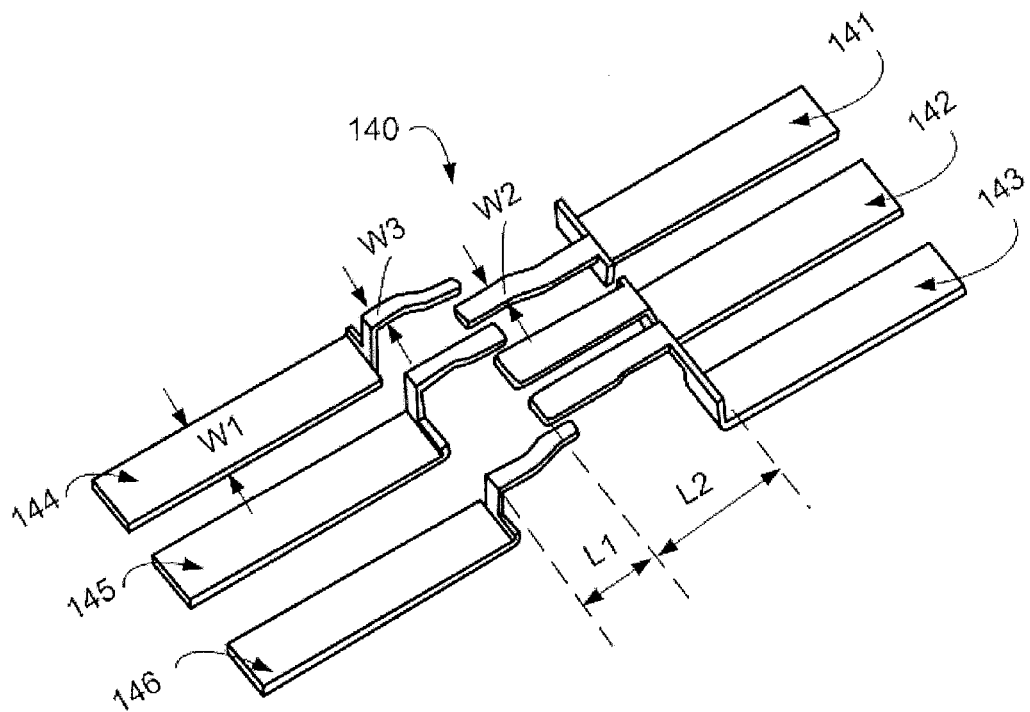
FIG. 22 illustrates a perspective view of a bent lead frame of the lead frame illustrated in FIG. 21.

LED package 100 may also includes a conductive lead frame 140 as best seen in FIG. 22. Conductive lead frame 140 includes a plurality of electrically conductive cathode parts 144-146 and a corresponding plurality of electrically conductive anode parts 141-144. Electrically conductive cathode parts 144-146 each have a respective contact pad 154-156. Electrically conductive anode parts 141-143 each have a corresponding mounting pad 151-153. In this embodiment, mounting pad 151 carries an LED 131, mounting pad 152 carries an LED 132, and mounting pad 153 carries an LED 133. As will be described in more details below, contact pads 154-156 and the mounting pads 151-153 have different surface areas. For example, each contact pad 154-156 has a smaller surface area than each corresponding mounting pad 151-153. Each contact pad 154-156 may have a longer profile length than each corresponding mounting pad 151-153. Alternatively or additionally, each contact pad 154-156 may have a wider profile width than each corresponding mounting pad 151-153. As illustrated in FIG. 1-2, the plurality of electrically conductive cathode parts 144-146 and the corresponding plurality of electrically conductive anode parts 141-143 have bent portions that traverse the mounting surface 112 and the exposed lower surface 114 of inner portion 110. Thus, lead frame 140 also increases the adhesion between the inner portion 110 and the outer portion 120.

Figure 3:
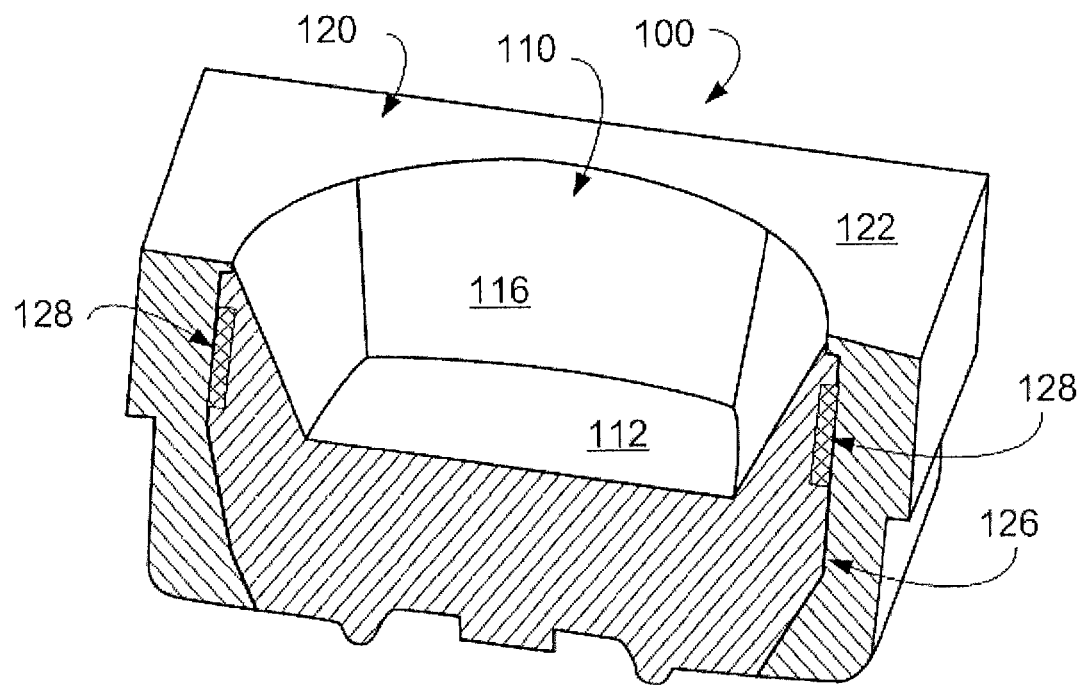
FIG. 3 illustrates a partial cutaway side perspective view of the LED package of FIG. 1.

FIG. 3 illustrates a partial cutaway side perspective view of LED package 100. Inner portion 110 has a side wall surface 116. Side wall surface 116 may be inclined relative to mounting surface 112 and thus creates a cavity to mount LEDs. In accordance with an aspect of the disclosure, inner portion 110 and outer portion 120 are made of different materials having different optical properties. Inner portion 110 and the outer portion 120 may have different colors, different light absorbing properties, different light reflectivities, or the like. For example, inner portion 110 and outer portion 120 may be made of plastic or similar material having different colors. For example, inner portion 220 may comprise light color polyphthalamide(PPA) and outer portion 120 comprises dark PPA. The material of inner portion 110 and outer portion 120 may have different melting points such that the two portions may be molded at different temperatures. For example, during fabrication, outer portion 120 may be molded before inner portion 110 is molded. It is preferable to increase adhesion between outer portion 120 and inner portion 110 by introducing extra features at the contact interface. For example, an inner surface 126 of outer portion 120 may have obtrusion patterns 128 that match a plurality of grooves on inner portion 110.

Figure 4:
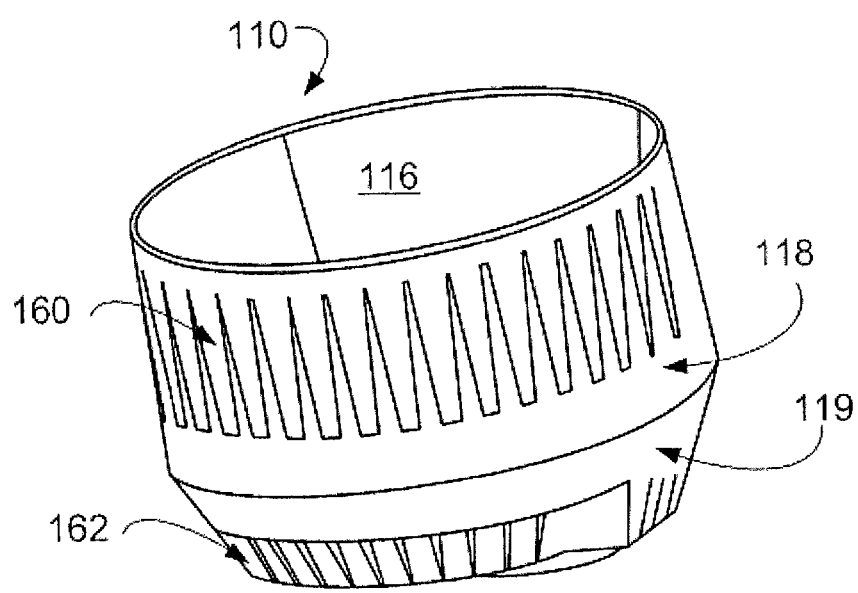
FIG. 4 illustrates a perspective view of the first plastic portion of FIG. 1.

FIG. 4 illustrates inner portion of FIG. 1. Inner portion 110 has an upper outer surface 118 and a lower outer surface 119. To increase the contact interface between inner portion 110 and outer portion 120, a plurality of interlocking features are added on inner portion 110. In this embodiment, there are a plurality of grooves 160 on upper outer surface 118 and a plurality of grooves 162 on lower outer surface 119. Those skilled in the art will appreciate that the interlocking patterns on upper outer surface 118 and lower outer surface 119 may include threads, legs, cuts, bends, spot punches, tabs, and steps, and the like.

Figure 5:
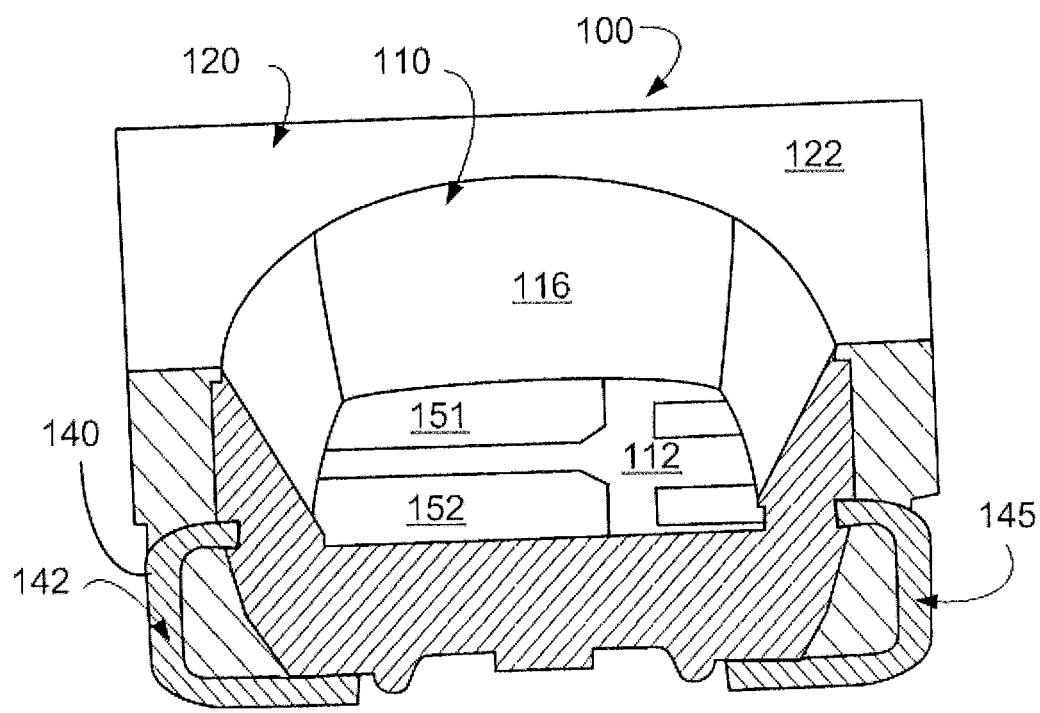
FIG. 5 illustrates a partial cutaway side perspective view of the LED package of FIG. 1 showing a lead frame.

FIG. 5 illustrates a partial cutaway side perspective view of the LED package 100 of FIG. 1 having a lead frame 140 positioned within the LED package. Inner portion 110 and outer portion have substantially equal profile heights in this embodiment. The bent portions of lead frame 140 traverse outer surface of outer portion 120 and lower surface 114 of inner portion 110. Thus, lead frame 140 also helps to improve the adhesion between inner portion 110 and outer portion 120. Thus, the disclosed LED package 100 provides a robust water proof LED device with improved water resistance and extended life span. Additionally, the disclosed water proof LED package can be produced at low cost by reducing the material used in outer portion 120, which can be more expensive than material used for inner portion 110.

Figure 6:
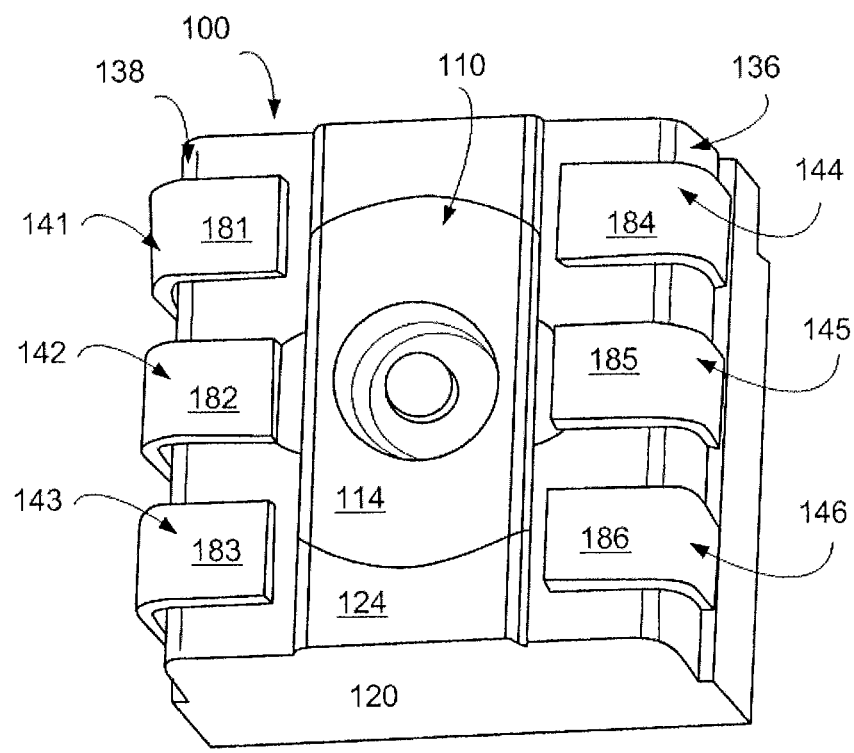
FIG. 6 illustrates a bottom perspective view of a second embodiment of an LED package in accordance with the disclosure.
Figure 7:
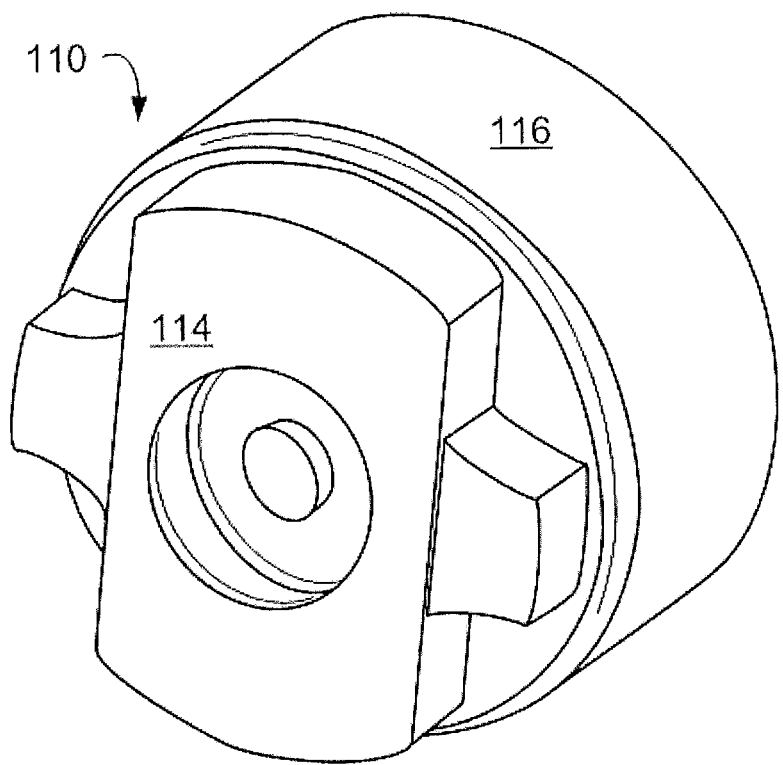
FIG. 7 illustrates a bottom perspective view of a first plastic portion of the LED package of FIG. 6.
Figure 8:
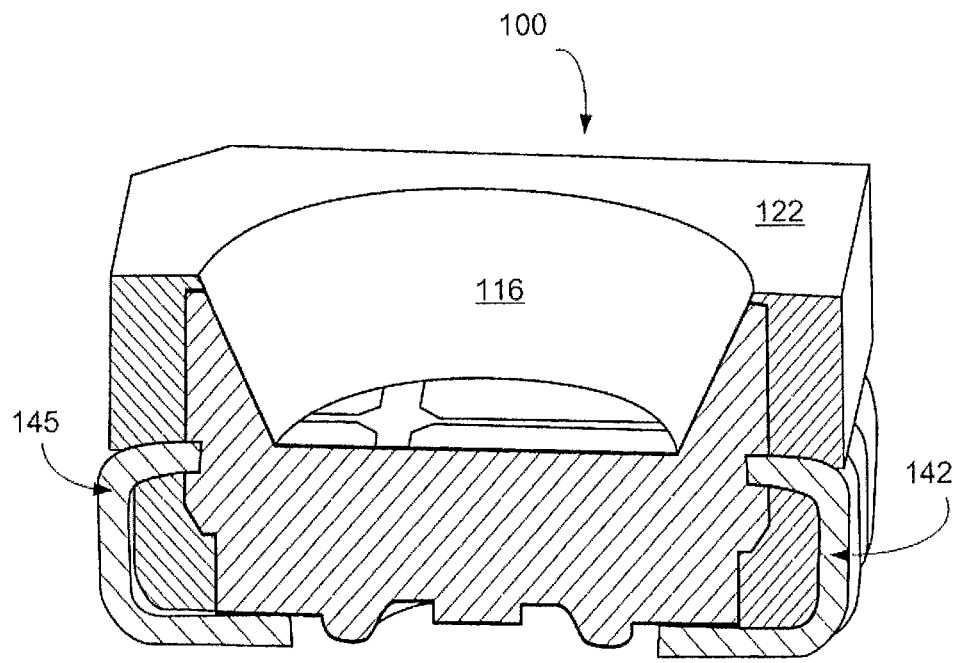
FIG. 8 illustrates a partial cutaway side perspective view of the LED package of FIG. 6 having a lead frame.

FIG. 6-8 illustrate different perspective views of a second embodiment of LED package 100. FIG. 6 illustrates a bottom perspective view of LED package 100 in accordance with the second embodiment, FIG. 7 illustrates the inner portion 110 of FIG. 6, and FIG. 8 illustrates a partial cutaway side perspective view of the LED package of FIG. 6 having a lead frame. One difference between the second embodiment and the first embodiment is that the lower surface 114 of inner portion 110 includes a relieved structure having a cross pattern as best seen in FIG. 7.

Figure 9:
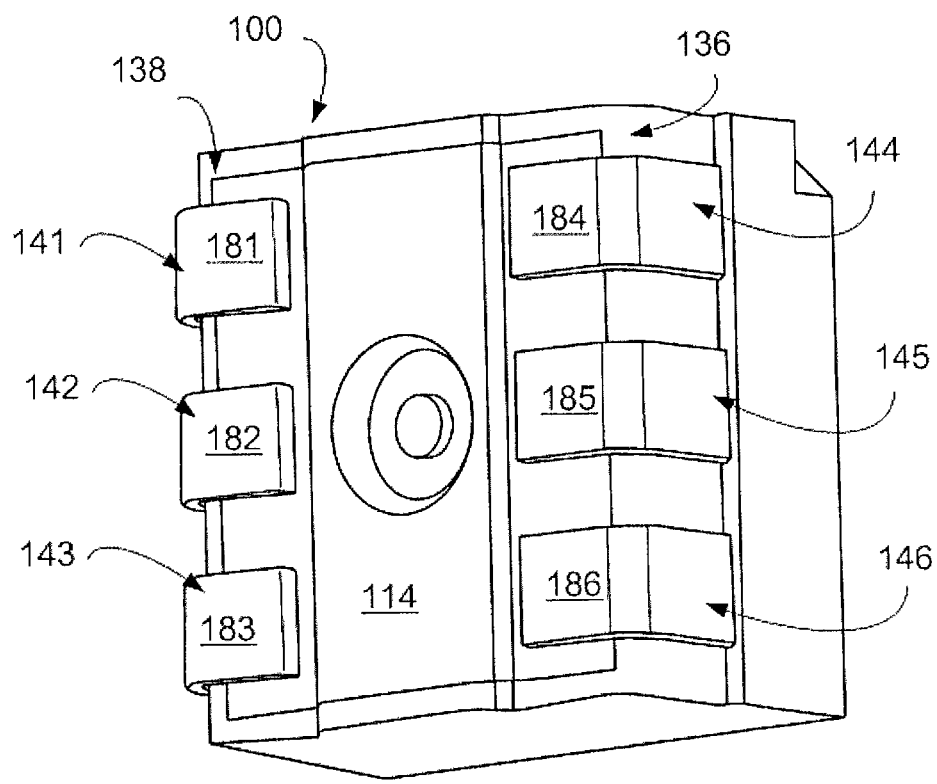
FIG. 9 illustrates a bottom perspective view of a third embodiment of an LED package in accordance with the disclosure.
Figure 10:
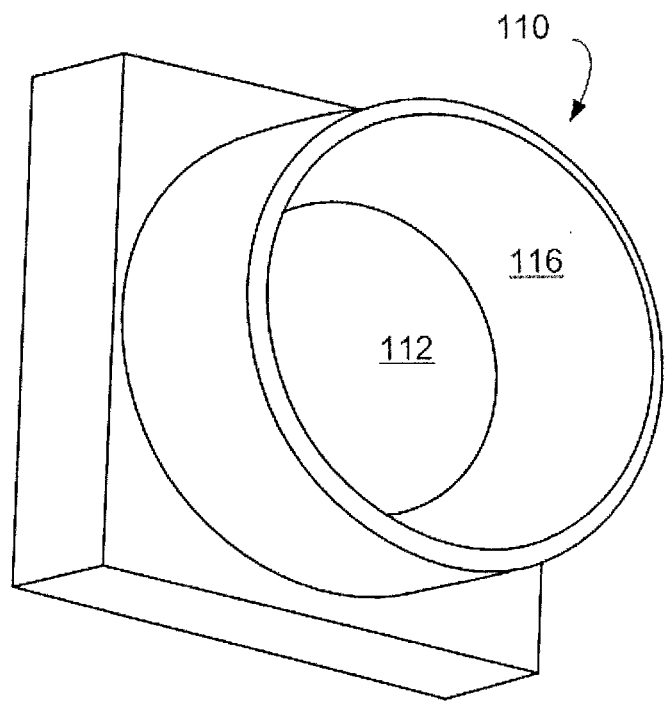
FIG. 10 illustrates a perspective view of the first plastic portion of the LED package of FIG. 9.
Figure 11:
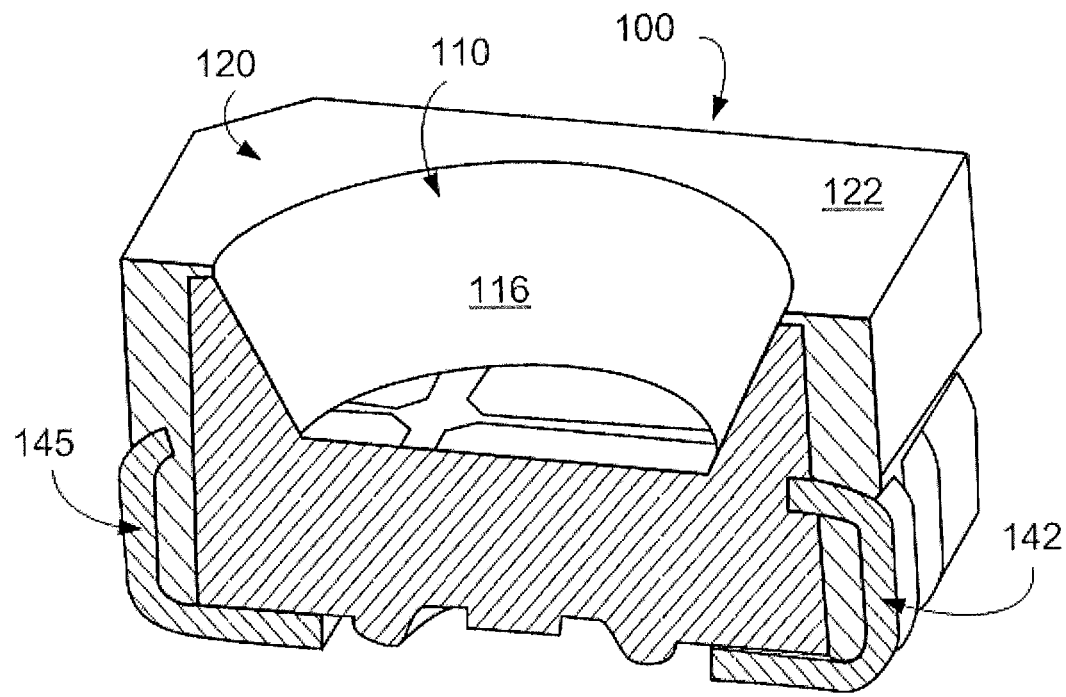
FIG. 11 illustrates a partial cutaway side perspective view of the LED package of FIG. 9 having a lead frame.

FIG. 9-11 illustrate different perspective views of a third embodiment of LED package 100. FIG. 9 illustrates a bottom perspective view of a third embodiment of an LED package, FIG. 10 illustrates the inner portion 110 of FIG. 9, and FIG. 11 illustrates a partial cutaway side perspective view of the LED package of FIG. 9 having a lead frame. One difference between the third embodiment and the first embodiment is that lower surface 114 of inner portion 110 has a substantial rectangular shape, and lower surface 114 has an area greater than an area of mounting surface 112, as best seen in FIG. 10.

Figure 12:
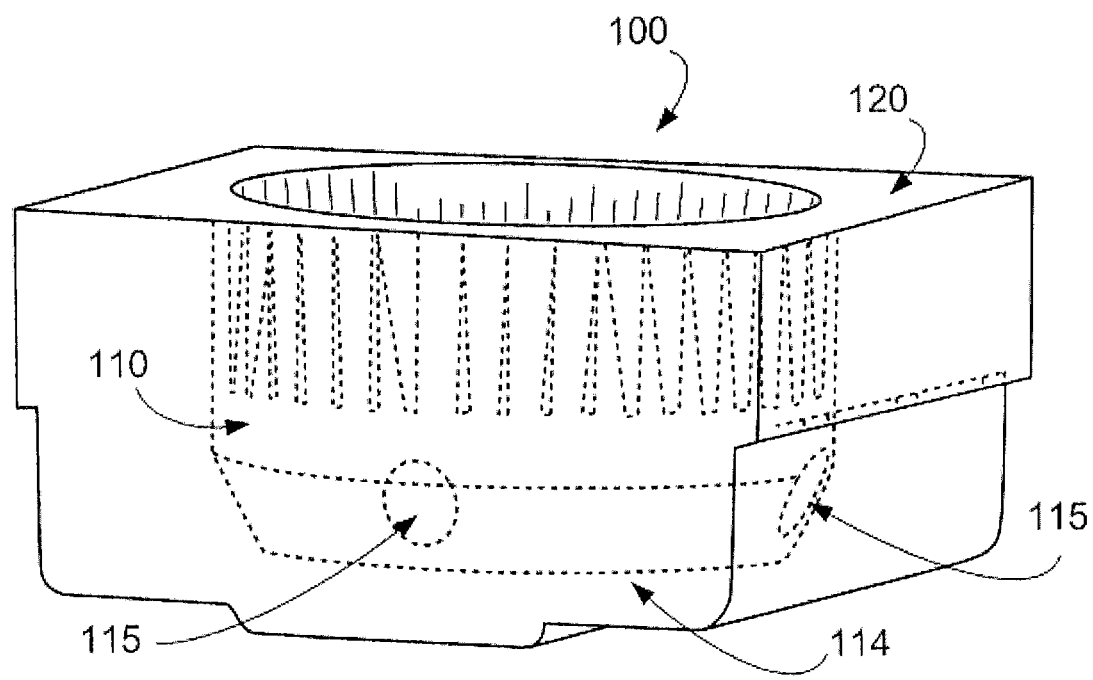
FIG. 12 illustrates a perspective view of an LED package in accordance with a fourth embodiment of the present disclosure.

FIG. 12-15 illustrate different perspective views of a fourth embodiment of LED package 100. FIG. 12 illustrates a perspective view of LED package 100 in accordance with a fourth embodiment of the present disclosure. Differences between the fourth embodiment and the first embodiment includes the feature that lower surface 114 of inner portion 110 is not exposed, and inner portion 110 has a plurality of through holes 115 near lower surface 114. In the illustrated embodiment, through holes 115 are disposed between mounting surface 112 and lower surface 114, and through holes 115 have center axes substantially parallel to mounting surface 112.

Figure 13:
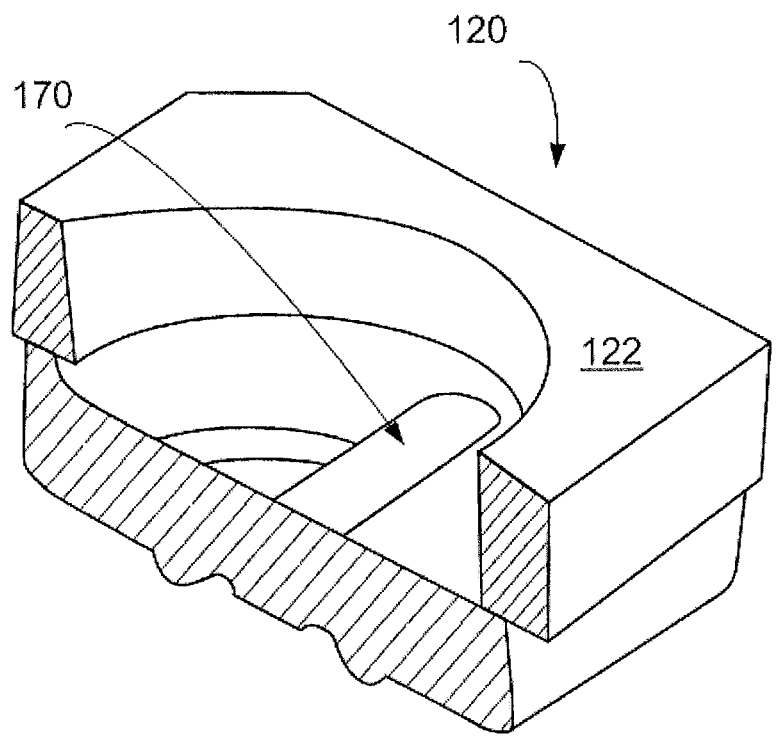
FIG. 13 illustrates a perspective view of an embodiment of an outer portion of the LED package of FIG. 12.
Figure 14:
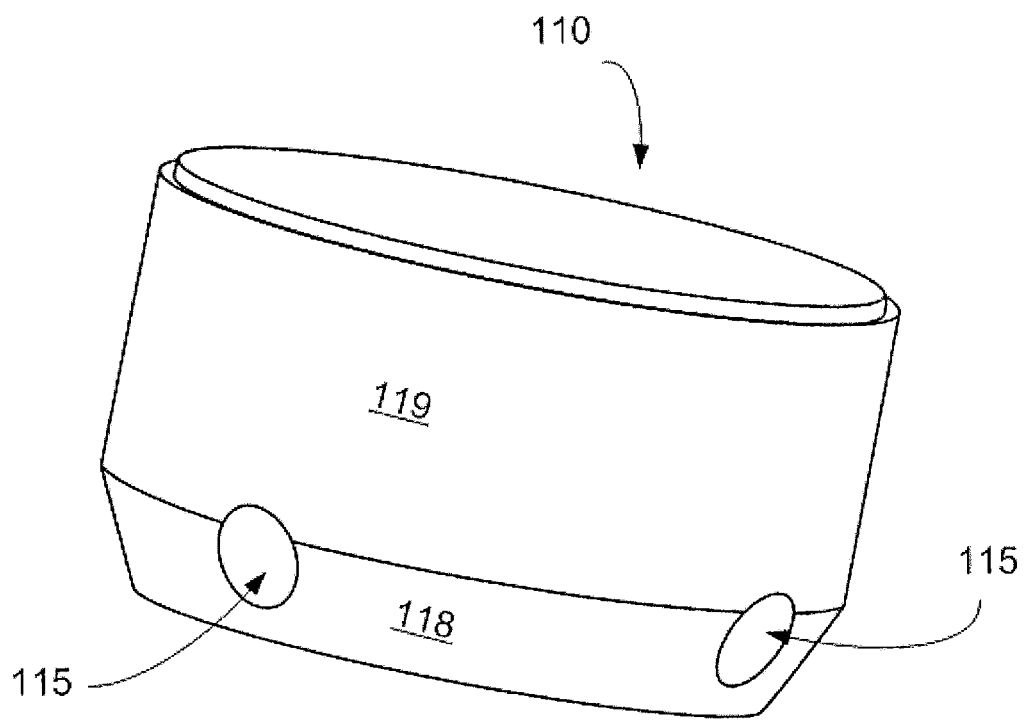
FIG. 14 illustrates a perspective view of an embodiment of a corresponding inner portion of the LED package of FIG. 12.
Figure 15:
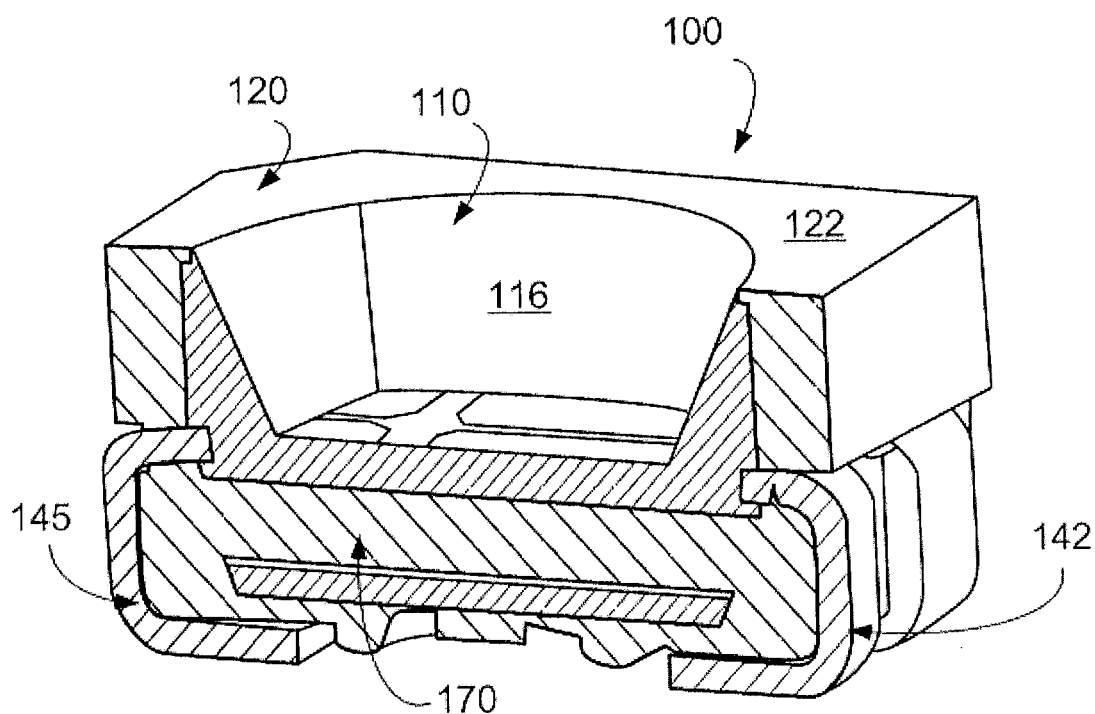
FIG. 15 illustrates a partial cutaway side perspective view of the LED package of FIG. 12 having a lead frame.

FIG. 13 illustrates an embodiment of outer portion 120 of FIG. 12, FIG. 14 illustrates an embodiment of the corresponding inner portion of FIG. 12, and FIG. 15 illustrates a partial cutaway side perspective view of the LED package of FIG. 12 having a lead frame. In FIG. 13, outer portion 120 has a corresponding structure 170 that fills through hole 115 of inner portion 110 in FIG. 14. In the illustrated embodiment in FIG. 14, inner portion 110 has a plurality of through holes 115 disposed between a mounting surface and a lower surface. However, those skilled in the art will appreciate that the through holes may be disposed at other locations within inner portion 110 that will provide increased contact interface area between inner portion and outer portion. In this embodiment, corresponding structure 170 is a peg that traverses outer portion 120 in through hole 115 below a geometrical center of mounting surface 112 as illustrated in FIG. 15. Peg 170 thus secures inner portion 110 and outer portion 120. In addition to the through hole 115, inner portion 110 may further include at least one of the following securing features that cooperate with the reciprocal features of outer portion 120: grooves, threads, legs, cuts, bends, spot punches, tabs, steps and the like.

Figure 16:
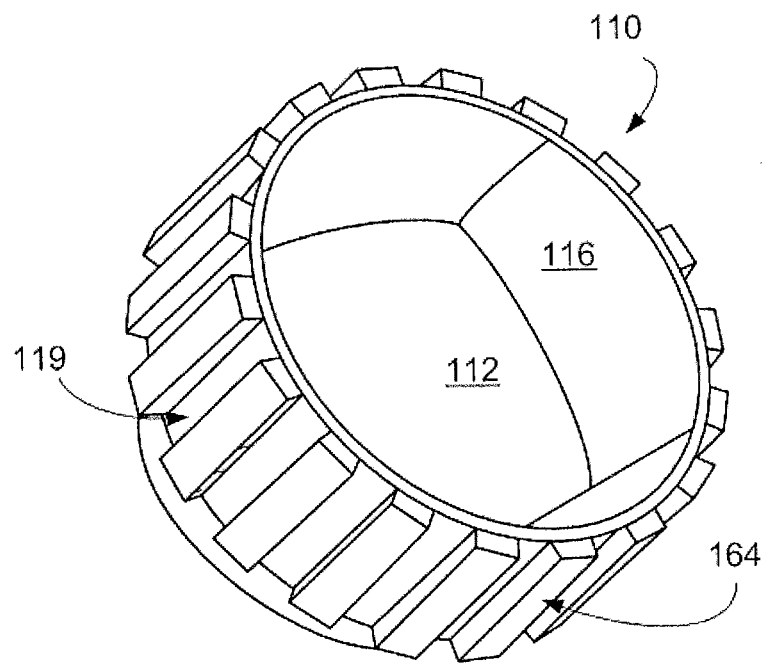
FIG. 16 illustrates a perspective view of an embodiment of an inner portion of an LED package in accordance with a fifth embodiment of the present disclosure.
Figure 17:
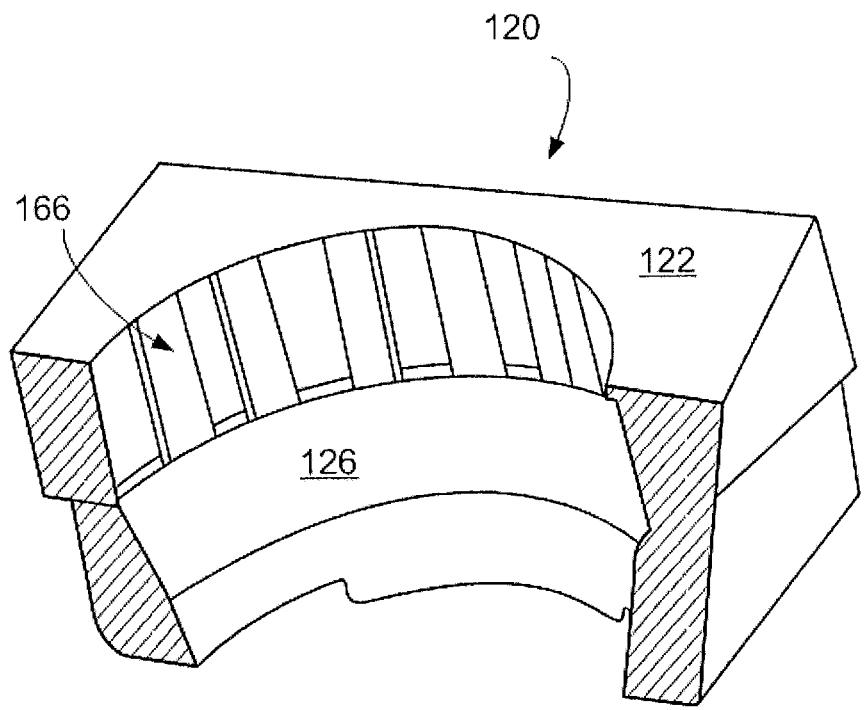
FIG. 17 illustrates a partial cutaway side perspective view of an outer portion corresponding to the inner portion of FIG. 16.

FIG. 16-17 illustrate different perspective views of a fifth embodiment of LED package 100. FIG. 16 illustrates an embodiment of inner portion 110 of an LED package 100. FIG. 17 illustrates a partial cutaway side perspective view of outer portion 120 corresponding to the inner portion 110 of FIG. 16. One difference between the fifth embodiment and the fourth embodiment is that inner portion 110 has an outer surface 119 having a plurality of protrusions 164 as illustrated in FIG. 16. Accordingly, outer portion 120 has an inner surface 126 with a plurality of grooves 166 that mate with the protrusions 164 as illustrated in FIG. 17. The plurality of protrusions 164 and the plurality of grooves 166 interlock with each other and increase the adhesion between inner portion 110 and outer portion 120. Those skilled in the art will appreciate that grooves 166 may have different shapes such as curved grooves or the like. Also, other similar features may be introduced to further enhance the adhesion between inner portion 110 and outer portion 120.

Figure 18:
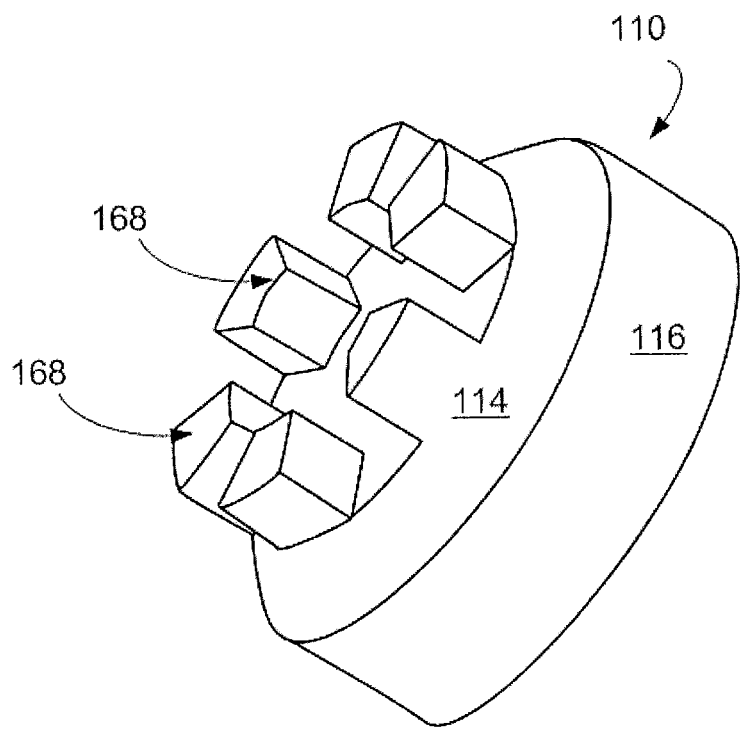
FIG. 18 illustrates a perspective view of an embodiment of the inner portion of an LED package in accordance with a sixth embodiment of the present disclosure.
Figure 19:
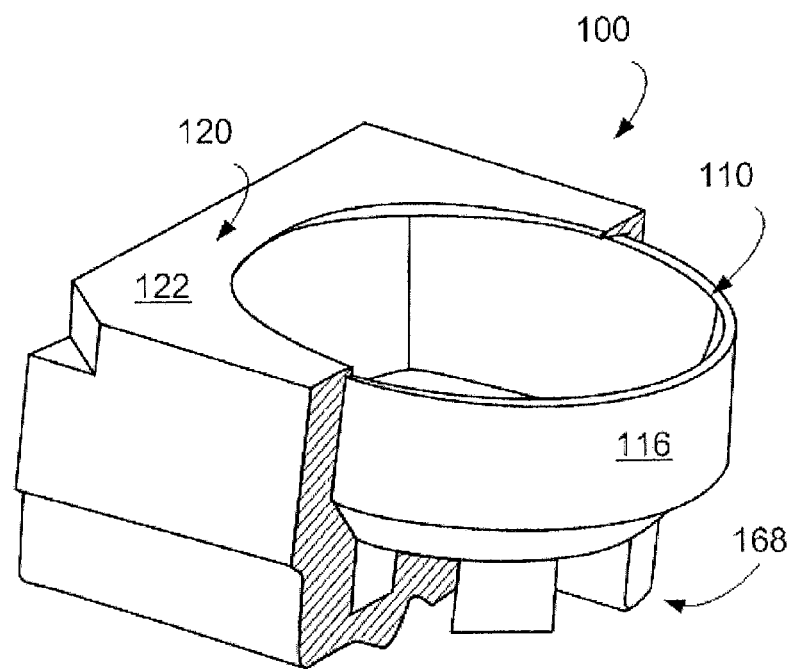
FIG. 19 illustrates a partial cutaway side perspective view of an LED package including the inner portion of FIG. 18.

FIG. 18-19 illustrate different perspective views of a sixth embodiment of LED package 100. FIG. 18 illustrates an embodiment of inner portion 110 of an LED package 100, and FIG. 19 illustrates a partial cutaway side perspective view of LED package 100 including the inner portion 110 of FIG. 18. One difference between the sixth embodiment and the fourth embodiment is that inner portion 110 has a plurality of protrusions under 168 under lower surface 114 as illustrated in FIG. 18. Accordingly, outer portion 120 has a corresponding receiving structure that accommodates the plurality of protrusions 168 as illustrated in FIG. 19. Protrusions 168 in this embodiment have shapes similar to table legs that increase the contact interface between inner portion 110 and outer portion 120 as best seen in FIG. 19. Those skilled in the art will appreciate that protrusions 168 may have other shapes or includes steps or grooves on the protrusions to further increase contact interface and adherence. The disclosed embodiments thus make the LED package more durable and also reduce the manufacturing cost by reducing the material used in the outer portion.

In some embodiments, the disclosed LED packages may have profile length preferably less than about 5.5 mm, more preferably less than about 4.5 mm, and most preferably, less than about 3.5 mm. The disclosed LED packages may have profile width preferably less than about 5.5 mm, more preferably less than about 4.5 mm, and most preferably less than about 3.5 mm. The disclosed LED packages may have profile height preferably less than about 3.0 mm, more preferably less than about 2.8 mm, and most preferably, less than about 1.8 mm. The inner portion preferably has a cavity depth less than about 1.5 mm, more preferably less than about 1.0 mm, and most preferably less than about 0.8 mm.

The above embodiments illustrate different interlocking features to improve the adherence between inner portion 110 and outer portion 120. With these interlocking features, LED package 100 has a durable structure that protects LEDs 131-133 and thus improves the life span of LEDs 131-133. Those skilled in the art will appreciate that the different interlocking features may be combined to meet specific design requirement or make tradeoffs among different performance parameters.

Figure 20:
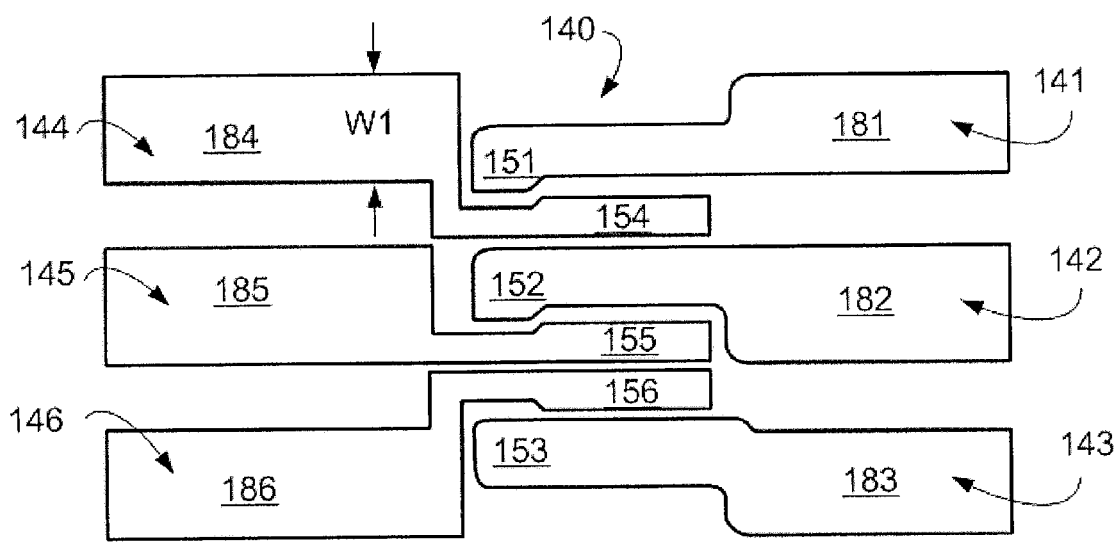
FIG. 20 illustrates a plan view of a first embodiment of a lead frame incorporated in the LED package according to the previously illustrated embodiments.

FIG. 20 illustrates a first embodiment of a lead frame 140 that may be incorporated in LED package 100. Lead frame 140 includes a plurality of electrically conductive cathode parts 144-146 each having a respective contact pad 154-156. Lead frame 140 further includes a corresponding plurality of electrically conductive anode parts 141-143 each having a respective corresponding mounting pad 151-153. Each contact pad 154, 155, or 156 has a thinner profile width than the corresponding mounting pad 151, 152, or 153. Lead frame 140 in this embodiment may be formed on a single conductive metal piece. This is very different from conventional lead frame that needs to be formed using two conductive metal pieces. Thus, lead frame 140 saves processing time and material. Also, because lead frame 140 is cut from a single metal piece, lead frame 140 guarantees that electrically conductive anode parts 141-143 and electrically conductive cathode parts 144-146 fit perfectly to each other and fit tightly mounting surface 112 of inner portion 110 and outer surface 129 of outer portion 120 as illustrated in FIG. 1.

Figure 21:
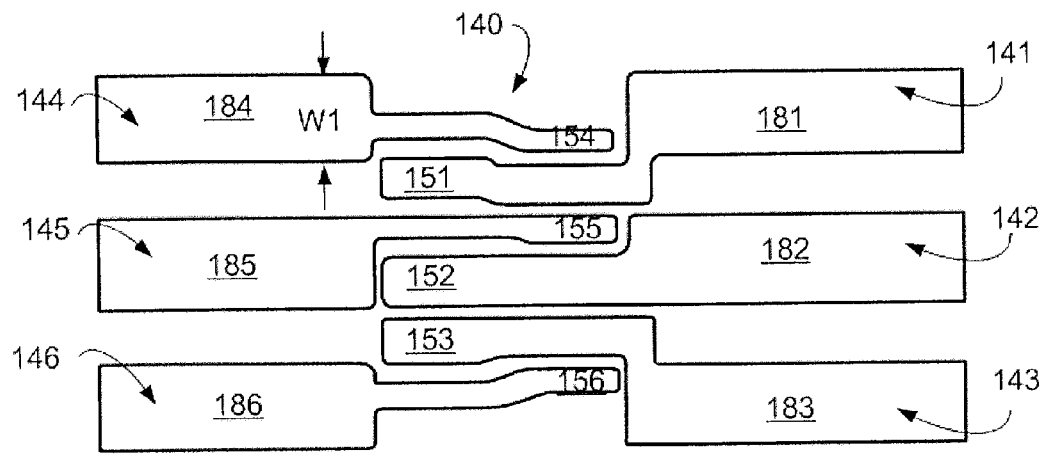
FIG. 21 illustrates a plan view of a second embodiment of a lead frame incorporated in the LED package according to the previously illustrated embodiments.

FIG. 21 illustrates a second embodiment of lead frame 140 that may be incorporated in disclosed LED package 100. One difference between the first and second embodiments of lead frame 140 is that mounting pads 151-153 in FIG. 20 have greater area compared with mounting pads 151-153 in FIG. 21.

Figure 23:
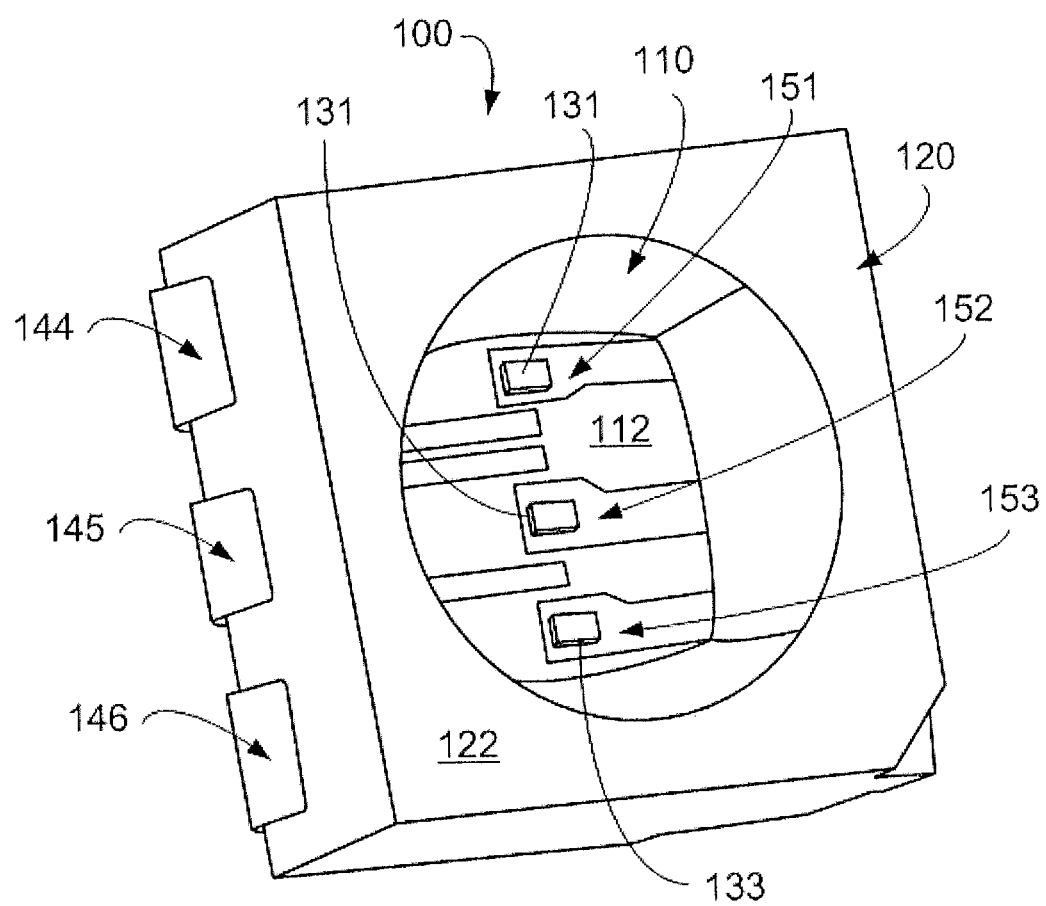
FIG. 23 illustrates a top perspective view of an LED package including the lead frame of FIG. 21.

FIG. 22 illustrates a bent lead frame of FIG. 21. FIG. 23 illustrates a top perspective view of an LED package including the lead frame of FIG. 21. After bending lead frame 140, as illustrated in FIG. 22, the bent portion of the contact pad 154-156 has a shorter profile length L1 than a length L2 of the corresponding bent portion of mounting pad 151-153.

In FIG. 23, the bent portions are disposed on mounting surface 112. Contact pads 154-156 and corresponding mounting pads 151-153 have bent portions traverse a curved mounting surface 112 of inner portion 110 in LED package 100 as illustrated in FIG. 23.

Each of the electrically conductive cathode parts 144-146 includes a cathode pin pads 184-186 having a bent portion that traverses a first curved portion 136 in LED package 100 in FIGS. 2 and 6. Each of the electrically conductive anode parts 141-143 include an anode pin pads 181-183 having a bent portion that traverses a second curved portion 138 in the LED package 100 in FIGS. 2 and 6. Each anode pin pads 181-183 and each cathode pin pads 184-186 are characterized by a profile width W1. In one embodiment, the anode pin pads and the cathode pin pads have substantially the same profile width. Anode pin pads 181-183 and cathode pin pad 184-186 have profile widths W1 wider than a profile width W2 of mounting pads 151-153. Each contact pads 154-156 have a thinner profile width W3 than the profile width W2 of each corresponding mounting pads 151-153 as best seen in FIG. 21. Those skilled in the art will appreciate that the anode pin pads and cathode pin pads of the lead frame may have slightly different shapes as long as they correspond to each other and thus reduce the manufacturing cost and time compared to conventional lead frames.

Figure 24:
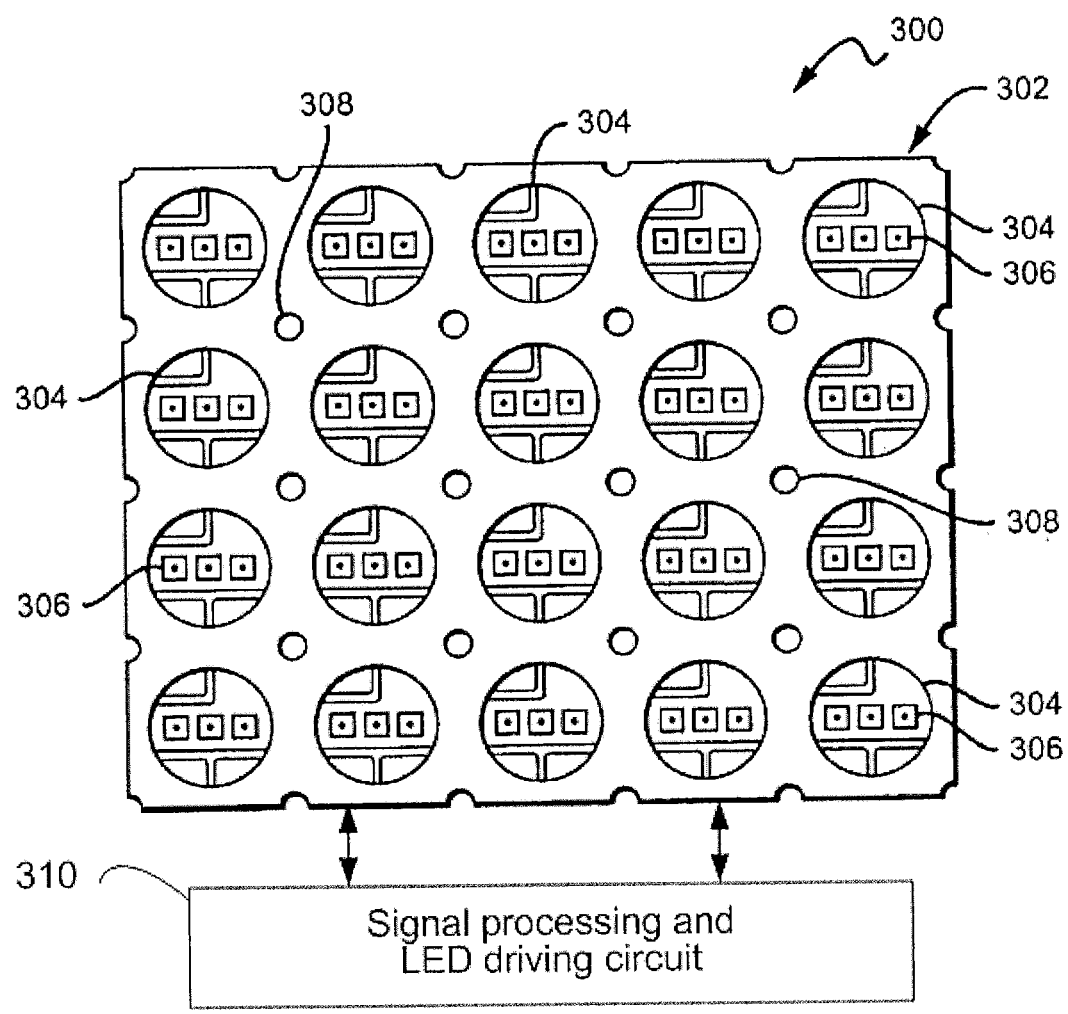
FIG. 24 is a plan perspective view of a portion of an LED display screen.
Figure 25:
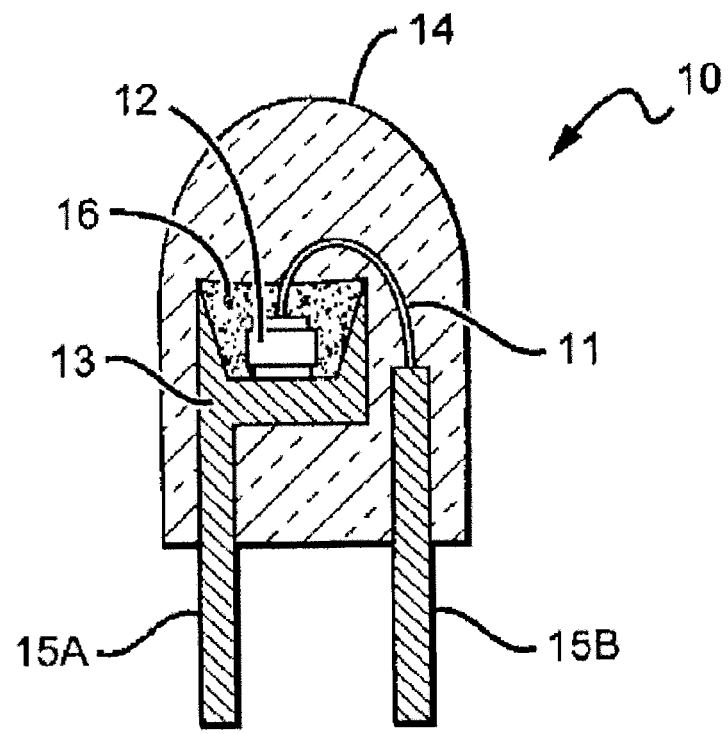
FIG. 25 is a side view of a conventional light emitting diode package.
Figure 26:
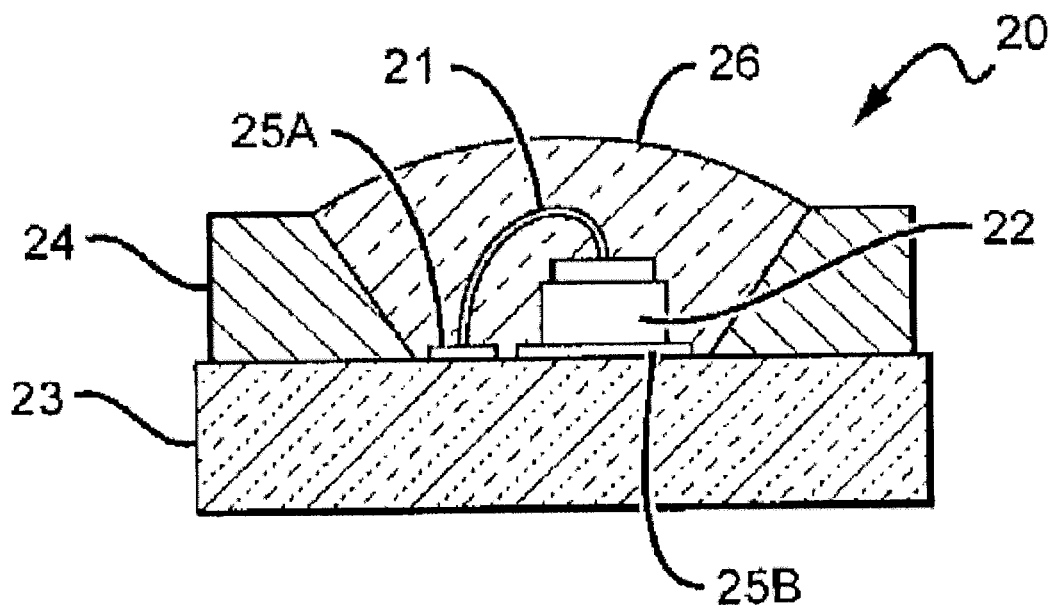
FIG. 26 is a perspective view of another conventional light emitting diode package.

FIG. 24 is a plan perspective view of a portion of an LED display screen 300, for example, a display screen including a driver PCB 302 carrying a large number of LED devices 304 arranged in rows and columns. Display screen 300 is divided into a plurality of pixels, each having an LED device 304 and each LED device includes a substrate carrying a plurality of LEDs 306. There may be a plurality of LED devices 304 in a pixel. Each LED device may be driven by different voltage levels. LED devices 304 include LED packages 100 such as those described above and illustrated in FIG. 1-19. The LED devices are electrically connected to metal traces or pads (not shown) on PCB 302 that connected the LEDs to appropriate electrical signal processing and driver circuitry 310. The signal processing and LED drive circuitry 310 are electrically connected to selectively energize LEDs 306 in LED devices 304 for producing visual images on the display. There may be holes 308 between pixels used to anchor the PCB 302 to mounting platforms.

Thus it is apparent that there has been disclosed an LED package that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, various formulations light and dark polyphthalamide(PPA) can be used. It is therefore intended to include within the invention all such variations and modifications as fall within the scope of the appended claims and equivalents thereof.

The invention claimed is:

1. A light emitting diode (LED) package comprising:
    a first plastic portion having a mounting surface and a lower surface; and
    a second portion surrounding the first plastic portion and exposing the mounting surface and the lower surface of the first plastic portion,
    wherein the first plastic portion and the second portion have different optical properties.

2. The LED package of claim 1, wherein the first plastic portion further comprises an outer wall surface having a plurality of grooves, and wherein the second portion includes an inner surface with patterns that matches the plurality of grooves.

3. The LED package of claim 1, wherein the lower surface of the first plastic portion includes a relieved structure having a cross pattern.

4. The LED package of claim 1, wherein the lower surface of the first plastic portion has a substantial rectangular shape, and the lower surface has an area greater than an area of the mounting surface.

5. The LED package of claim 1, wherein the lower surface of the first plastic portion has a plurality of holes, and wherein protrusions of the second portion extend into the holes and secure the second portion to the first plastic portion.

6. The LED package of claim 5, wherein the plurality of holes are disposed between the mounting surface and the lower surface, and the holes have center axes substantially parallel to the mounting surface.

7. The LED package of claim 1, wherein the first plastic portion and the second portion have different colors.

8. The LED package of claim 7, wherein the first plastic portion and the second portion have different light absorbing properties.

9. The LED package of claim 7, wherein the first plastic portion and the second portion have different light reflectivities.

10. The LED package of claim 7, wherein the first plastic portion comprises light color polyphthalamide(PPA) and the second portion comprises dark PPA.

11. The LED package of claim 1, wherein the first plastic portion and the second portion have substantially equal profile heights.

12. The LED package of claim 1, further comprising a conductive lead frame that comprises:
    a plurality of electrically conductive cathode parts each having a contact pad; and
    a corresponding plurality of electrically conductive anode parts each having a corresponding mounting pad carrying an LED,
    wherein the contact pad and the mounting pad have different surface areas.

13. The LED package of claim 12, wherein the plurality of electrically conductive cathode parts and the corresponding plurality of electrically conductive anode parts have bent portions that traverse the mounting surface and the lower surface of the first plastic portion.

14. A light emitting diode (LED) package comprising:
    a first plastic portion having a mounting surface and a lower surface; and
    a second portion surrounding the first plastic portion and exposing the mounting surface and the lower surface of the first plastic portion,
    wherein the first plastic portion further comprises an outer wall surface having a plurality of grooves.

15. The LED package of claim 14, wherein the second portion includes an inner surface with patterns that matches the plurality of grooves.

16. The LED package of claim 14, wherein the first plastic portion comprises light color polyphthalamide(PPA) and the second portion comprises dark PPA.

17. The LED package of claim 14, wherein the first plastic portion and the second portion have substantially equal profile heights.

18. The LED package of claim 14, further comprising a conductive lead frame that comprises:
    a plurality of electrically conductive cathode parts each having a contact pad; and
    a corresponding plurality of electrically conductive anode parts each having a corresponding mounting pad carrying an LED,
    wherein the contact pad and the mounting pad have different surface areas.

* * * * *